United States Patent
Burmeister et al.

(10) Patent No.: US 7,976,750 B2
(45) Date of Patent: Jul. 12, 2011

(54) METHOD OF ENCAPSULATING OPTOELECTRONIC COMPONENTS

(75) Inventors: Axel Burmeister, Buchholz (DE); Franziska Zmarsly, Hamburg (DE)

(73) Assignee: Tesa SE, Hamburg (DE)

(*) Notice: Subject to any disclaimer, the term of this patent is extended or adjusted under 35 U.S.C. 154(b) by 0 days.

(21) Appl. No.: 12/437,743

(22) Filed: May 8, 2009

(65) Prior Publication Data

US 2009/0289381 A1 Nov. 26, 2009

(30) Foreign Application Priority Data

May 21, 2008 (DE) .................. 10 2008 024 551

(51) Int. Cl.
- *B29C 44/12* (2006.01)
- *B29C 44/24* (2006.01)
- *B29C 44/30* (2006.01)
- *B29C 44/32* (2006.01)

(52) U.S. Cl. ............ 264/46.5; 264/45.4; 264/46.2; 264/46.3; 264/173.11; 264/173.14; 264/175; 264/272.14; 264/272.15; 264/272.19; 264/272.16; 264/272.21

(58) Field of Classification Search ............ None
See application file for complete search history.

(56) References Cited

U.S. PATENT DOCUMENTS

| | | | |
|---|---|---|---|
| 3,007,205 A * | 11/1961 | House .................. 264/171.24 |
| 3,047,449 A * | 7/1962 | Coble .................. 264/46.3 |
| 3,590,425 A * | 7/1971 | Lieberman ............ 425/201 |
| 3,617,594 A * | 11/1971 | Willy .................. 264/45.3 |
| 3,686,047 A * | 8/1972 | Miller .................. 156/79 |
| 3,740,366 A | 6/1973 | Sanderson et al. |
| 3,770,780 A | 11/1973 | Hirsch |
| 3,790,553 A | 2/1974 | Rao et al. |
| 3,900,610 A | 8/1975 | McKenna, Jr. |
| 4,277,387 A | 7/1981 | Jordan, Jr. et al. |
| 4,290,248 A * | 9/1981 | Kemerer et al. ........ 52/309.16 |
| 4,540,533 A * | 9/1985 | Sahakian ............... 264/1.38 |
| 4,900,368 A * | 2/1990 | Brotz .................. 136/253 |
| 5,008,062 A * | 4/1991 | Anderson et al. ...... 264/272.15 |
| 5,667,595 A * | 9/1997 | Vaverka et al. ........ 136/251 |
| 6,550,852 B2* | 4/2003 | Patz et al. ............. 296/211 |
| 6,673,292 B1* | 1/2004 | Gustafson et al. ...... 264/149 |
| 7,049,803 B2* | 5/2006 | Dorner et al. ......... 428/423.1 |
| 2005/0000560 A1* | 1/2005 | Shiotsuka et al. ...... 136/243 |
| 2005/0056831 A1 | 3/2005 | Senda et al. |
| 2005/0067007 A1* | 3/2005 | Toft .................. 136/245 |
| 2005/0081993 A1 | 4/2005 | Ilkka et al. |
| 2007/0213459 A1 | 9/2007 | Tamai et al. |
| 2009/0092821 A1* | 4/2009 | Dharan ............... 428/314.4 |

FOREIGN PATENT DOCUMENTS

| | | |
|---|---|---|
| DE | 43 13 008 | 11/1994 |
| DE | 100 16 972 A1 | 10/2001 |
| EP | 0 006 571 | 1/1980 |
| EP | 0 578 151 | 1/1994 |
| EP | 1 302 988 | 4/2003 |
| JP | 09 312410 | 12/1997 |
| JP | 2003 133343 A | 5/2003 |
| WO | 94 22172 | 9/1994 |

* cited by examiner

*Primary Examiner* — Edmund H. Lee

(74) *Attorney, Agent, or Firm* — Norris, McLaughlin & Marcus, P.A.

(57) ABSTRACT

Method of encapsulating optoelectronic components, by embedding the components to be encapsulated between a first transparent polymer layer and a second polymer layer, which is filled with unactivated foaming agent, and then activating the foaming agent, so that the two polymer layers join to one another, in particular weld to one another, and the components are enclosed between the two polymer layers.

20 Claims, 4 Drawing Sheets

Sealing of the components with a roll laminator

4. MB filled polymer layer
5. cover
6. MB expanded in polymer layer
3. product to be encapsulated
8. assembly from Fig. 3 without auxiliary carrier 7

Fig. 1 Structure prior to sealing
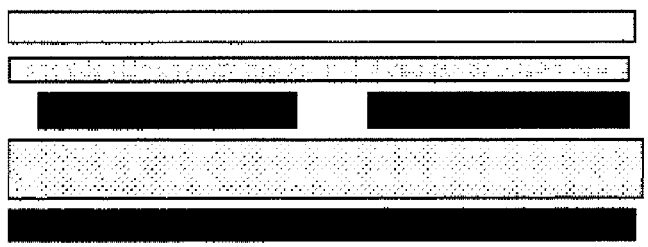
1. transparent cover
2. transparent polymer layer
3. product to be encapsulated
4. MB filled polymer layer
5. cover
Fig. 2 Structure after sealing
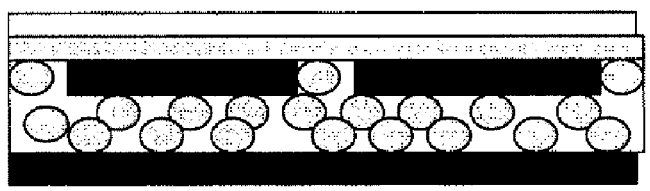
1. transparent cover
2. transparent polymer layer
3. product to be encapsulated
6. MB expanded in polymer layer
5. cover Fig. 3 Production of assembly of transparent cover with transparent polymer layer
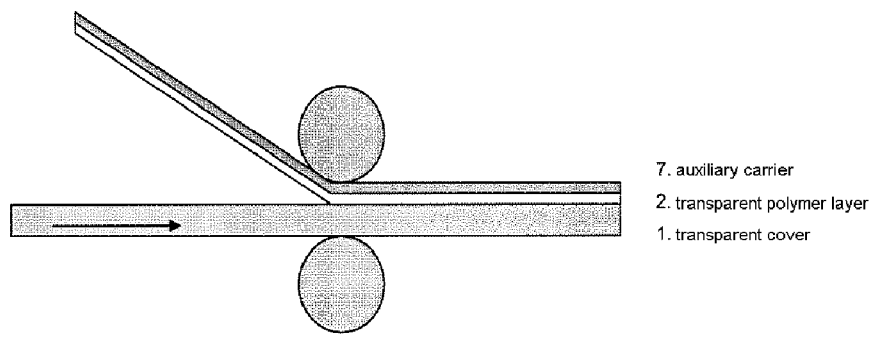
7. auxiliary carrier
2. transparent polymer layer
1. transparent cover
Fig. 4 Sealing of the components with a roll laminator
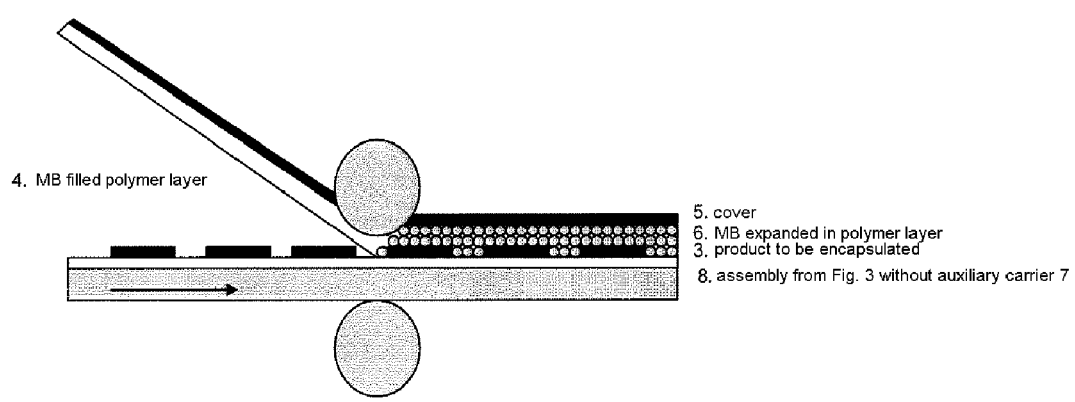
4. MB filled polymer layer
5. cover
6. MB expanded in polymer layer
3. product to be encapsulated
8. assembly from Fig. 3 without auxiliary carrier 7

Fig. 5 Sealing of the components with a roll laminator to give a flexible assembly
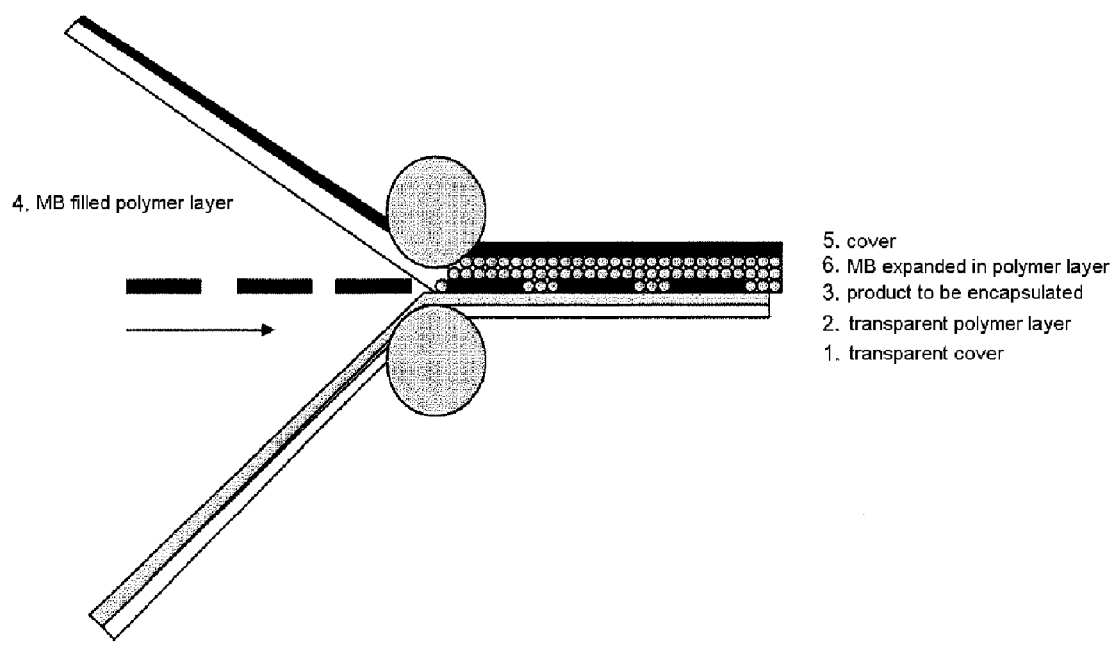
4. MB filled polymer layer
5. cover
6. MB expanded in polymer layer
3. product to be encapsulated
2. transparent polymer layer
1. transparent cover 1. 3 mm glass plate
2. 100 g/m² transparent polymer layer
3. product to be encapsulated, height 985 μm
4. 550 g/m² microballoon filled polymer layer
5. cover PET/PP/Al/PP/PET, thickness 142 μm 1. glass plate with transparent polymer layer
3. product to be encapsulated
8. fully sealed area between the two polymer layers
9. air inclusion, incomplete sealing

METHOD OF ENCAPSULATING OPTOELECTRONIC COMPONENTS

The invention relates to a method of encapsulating optoelectronic components.

The term optoelectronics (sometimes also called optronics or optotronics) came about from a combination of optics and microelectronics, and embraces in the widest sense all products and processes which all allow the conversions of electronically generated data and energies into light emission, and vice versa. The background is, for example, the attempt to combine the advantages of electronic data editing and processing with the advantages of the rapid and electromagnetically and electrostatically undisruptable broadband transmission capability of light. At the same time the term also encompasses the transformation of electrical energy into light, and vice versa, on the basis of electronic semiconductor technology.

Optoelectronic components are components which act as an interface between electrical and optical components, or else devices which comprise such components. The term refers usually (but not exclusively) to microelectronic components which function on the basis of semiconductors. Optoelectronic components can be divided into groups according to their function:

laser diodes optoelectronic actuators

These include all semiconductor assemblies which generate light from current, i.e. laser diodes and light-emitting diodes.

Optoelectronic detectors

These are the converse assemblies to the actuators, i.e. photoresistors, photodiodes (including solar cells) and phototransistors. Photomultipliers as well, however, are included in optoelectronics.

Where actuators and detectors are operated as a system, the result is an optical sensor, referred to as an optosensor.

The major sector in optoelectronic components is that dealing with what are called photovoltaic modules.

Photovoltaics is understood to be the direct conversion of radiation energy, principally solar energy, into electrical energy, using solar cells.

There are a variety of embodiments of solar cells. The most widespread are thick-layer silicon cells, in the form either of monocrystalline cells (c-Si) or multicrystalline cells (mc-Si). Becoming increasingly widespread are thin-film cells of amorphous silicon (a-Si), GaAs, CdTe, CIS—, CIGS, and organic solar cells and dye cells.

For energy recovery purposes, solar cells are usually connected to form large solar modules. For this purpose the cells are connected in series with conductor tracks on the front and back sides. As a result the voltage of the individual cells adds cumulatively.

The manufacture of a solar module is accomplished most widely with the optically active side downwards. First a corresponding glass, which is normally a low-iron, tempered white glass in a thickness of 3 to 4 mm, with very low absorption between 350 to 1150 nm, is cleaned and laid out ready. On top of it there is then a cut-to-size sheet of EVA film. The solar cells are joined by means of solder ribbons to form individual strands (called strings) and positioned on the screen with the EVA film. Then the interconnects which connect the individual strings to one another and lead to the site of the connection socket, are positioned and soldered. Subsequently the whole is covered in succession with a cut-to-size EVA film and a Tedlar (polyvinyl fluoride) film. The next step in production is the laminating of the module under reduced pressure and at about 150° C. At the laminating stage, the EVA film, which up to that point has been milky, turns into a clear, three-dimensionally crosslinked plastic layer that can no longer be melted, and the cells are then embedded in this layer and the layer is firmly connected to the glass screen and the back-side film. Following lamination, the edges are trimmed and the connection socket is attached. The module is then framed, subjected to measurement, classified according to its electrical values, and packaged.

The laminating operation is very time-consuming and energy-intensive, employing, in general, temperatures of 150° C. for 10 to 20 minutes. Attempts to accelerate laminating significantly have to date been unsuccessful at establishing themselves on the market. WO 94/22172 A1 proposes a roll laminator in place of the customary plate laminator. JP 09 312 410 A1 describes the use of a thermoplastic polyurethane.

EP 1 302 988 A1 describes a method of encapsulating and wire-connecting solar cells between two substrates which have a low water vapour permeability, through an aliphatic thermoplastic polyurethane.

A feature of all of the processes disclosed in the stated specifications is that the wired solar cells, which are in some cases 200 to 400 μm thick, must first be enclosed, in a slow process, in order to ensure reliable encapsulation.

Optoelectronic components frequently have to be protected from the ingress of water vapour and oxygen, and also protected mechanically, in order to suppress or prevent degradation of the components themselves or their contacting.

It is an object of the invention to provide a reliable and rapid method of encapsulating optoelectronic components that can be implemented using established processes and raw materials, without risky and high-cost investment.

This object is achieved by means of a method as characterized in more detail hereinbelow.

The invention accordingly provides a method of encapsulating optoelectronic components, by embedding the components to be encapsulated between a first transparent polymer layer and a second polymer layer, which is filled with unactivated foaming agent, and then activating the foaming agent, so that the two polymer layers join to one another, in particular weld to one another, and the components are enclosed between the two polymer layers.

BRIEF DESCRIPTION OF THE DRAWINGS

The invention will now be described in greater detail with reference to the drawings, wherein:

FIG. 1 depicts a structure prior to sealing;

FIG. 2 depicts a structure after sealing;

FIG. 3 depicts the production of assembly of transparent cover with transparent polymer layer;

FIG. 4 depicts sealing of components with a roll laminator;

FIG. 5 depicts sealing of components with a roll laminator to give a flexible assembly;

Figure 6:
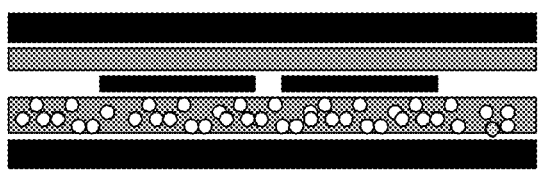
FIG. 6 depicts the experimental structure used in the Example.

The term "weld" is understood in accordance with the invention to mean that the polymer layers are joined to one another inseparably or that at least they can be separated only irreversibly with destruction of the resultant structure.

The skilled person of course selects the position of the components in such a way that the optically active side of the components is located below the transparent polymer layer.

The transparent polymer layer preferably has a transmittance of greater than 60%, more particularly a transmittance of greater than 90% for a wavelength of 350 to 1150 nm. The transmittance, which is generally specified in %, is the ratio of the light output that arrives at the reverse of a body through which light is transmitted, to the light output that is incident on the front face. The transmittance is curtailed by reflectance and absorption. The following is therefore the case: transmittance=(1−reflectance)×(1−absorption).

The polymer layer(s) may take the form alternatively of a heat-activable layer, a layer which adheres gently under applied pressure, or a layer which adheres strongly under pressure and without temperature.

Suitable starting materials for the first, transparent polymer layer are the same polymers as for the second polymer layer, which in particular is blended with unexpanded but expandable microballoons.

Besides the classic polymers such as EVA (for example Elvax® from DuPont), ethylene/methacrylic acid (for example Surlyn® from DuPont), TPU (Desmopan® from Bayer) and PVB (for example Butacite® from DuPont) it is also possible to use acrylates, silicone rubbers, PIB, and styrene block copolymers.

In a further embodiment of the invention the polymer layer(s) constitute(s) an adhesive based on polyethylene-vinyl acetate (EVA) with a vinyl acetate fraction of 10% to 90% by weight and with a melt index MFI to ISO 1133 (A/4) of 0.5 to 25 g/10 min at 190° C. and 2.16 kg.

In addition to EVA based systems, PIB and SBC based systems are outstandingly suitable as well, since they combine a very high adhesive bond strength with very low water vapour permeability.

In one particular embodiment the adhesive is based on polyisobutylene as the base polymer. In order to give the adhesive the necessary tack it is mixed with resins. A mixture of a medium-molecular-weight polyisobutylene with a higher-molecular-weight polyisobutylene is used as an elastomer. As the version with the greatest shear strength to date, it has proved to be appropriate to take, as the polyisobutylene component of medium molecular weight, a grade having an average molecular weight $M_w$ of 40 000, which is freely available commercially under the designation "Oppanol B10" from the company BASF SE, and, as a polyisobutylene component of high molecular weight, a grade having an average molecular weight $M_w$ of 2 600 000, which is likewise freely available under the designation "Oppanol B150".

Adhesives, preferably pressure-sensitive adhesives, used for the polymer layer(s) are, furthermore, those based on block copolymers containing polymer blocks formed from vinylaromatics (A blocks) such as, for example, styrene, and those formed by polymerisation of 1,3-dienes (B blocks) such as, for example, butadiene and isoprene, or a copolymer of the two. Mixtures of different block copolymers can also be employed. Products which are partly or fully hydrogenated can also be used.

The block copolymers may have a linear A-B-A structure. It is likewise possible to use block copolymers of radial design, and also star-shaped and linear multi-block copolymers. As a further component, use is made of A-B diblock copolymers, the fraction of diblock copolymers as a proportion of the overall elastomer content being at least 50%. Preference is given to using those block copolymers which possess a polystyrene content of more than 20% by weight.

Typical use concentrations for the block copolymer lie at a concentration in the range between 30% and 70% by weight, more particularly in the range between 35% and 55% by weight.

The adhesive of the polymer layer(s) may be crosslinked chemically, more particularly by radiation, for example by UV irradiation, or by irradiation using rapid electrons.

For the purpose of obtaining supplementary desired properties, the adhesive may be blended with one or more additives such as tackifier resins, plasticizers, aging inhibitors or fillers.

Tackifier resins, for raising the adhesive properties of the adhesive, are, for example, hydrocarbon resins (formed from unsaturated $C_5$ and/or $C_9$ monomers, for example), hydrogenated polymers of dicyclopentadiene, terpene-phenolic resins, terpene resins formed from raw materials such as α- or β-pinene, aromatic resins such as coumarone-indene resins or resins formed from styrene or α-methylstyrene, preferably non-hydrogenated, partially or fully hydrogenated resins based on rosin and its derivatives such as disproportionated, dimerized or esterified resins, esterification being possible using glycols, glycerol or pentaerythritol, and also others as set out in Ullmann's Enzyklopädie der technischen Chemie, volume 12, pages 525 to 555 (4th edition), Weinheim. Particular suitability is possessed by resins that are stable to aging, without an olefinic double bond, such as hydrogenated resins, for example. Particular preference is given to using polyterpene resins based on α-pinene and/or β-pinene and/or δ-limonene. Aforementioned tackifier resins can be used either alone or in a mixture.

Plasticizers, whose use is optional, are, for example, aliphatic, cycloaliphatic and aromatic mineral oils, diesters or polyesters of phthalic acid, trimellitic acid or adipic acid, polyethers, and liquid rubbers (for example nitrile rubbers or polyisoprene rubbers), liquid polymers of butene and/or isobutene, acrylic esters, polyvinyl ethers, liquid resins and plasticizer resins based on the raw materials for tackifier resins, wool wax and other waxes, or liquid silicones.

In order to make the adhesive even more resistant to the influence of UV, the addition of light stabilizers is possible. Their function lies primarily in preventing the decomposition of the adhesive. Suitable in particular for the adhesive are HALS light stabilizers such as, for example, dimethyl succinate polymer with 4-hydroxy-2,2,6,6-tetramethyl-1-piperidineethanol (CAS No. 65447-77-0), bis(2,2,6,6-tetramethyl-4-piperidinyl)sebacate (CAS No. 52829-07-9) or poly[[6-[(1,1,3,3-tetramethylbutyl)amino]-1,3,5-triazine-2,4-diyl][[(2,2,6,6-tetramethyl-4-piperidyl)imino] hexamethylene[(2,2,6,6-tetramethyl-4-piperidyl)imino]] (CAS No. 70624-18-9).

Further additives which can typically be utilized are as follows:
primary antioxidants such as, for example, sterically hindered phenols
secondary antioxidants such as, for example, phosphites or thioethers
in-process stabilizers such as C-radical scavengers, for example
light stabilizers such as, for example UV absorbers or sterically hindered amines
processing assistants
endblock reinforcer resins and
if desired, further polymers, preferably elastomeric in nature; elastomers which can be utilized accordingly include, among others, those based on pure hydrocarbons, examples being unsaturated polydienes such as natural or synthetic polyisoprene or polybutadiene, elastomers with substantial chemical saturation, such as, for example, saturated ethylene-propylene copolymers, α-olefin copolymers, polyisobutylene, butyl rubber, ethylene-propylene rubber, and chemically functionalized hydrocarbons such as, for example, halogen-containing, acrylate-containing or vinyl ether-containing polyolefins, to name but a few.

In a further preferred embodiment the polymer layer(s) is (are) composed of an acrylate, and feature high aging stability, very high bonding values and low absorption. Preferably the adhesive is based on acrylate polymers or polyethylene-vinyl acetate polymers.

Acrylate dispersions are known and are used both for adhesive-tape adhesives and for label adhesives in large quantities. The acrylate dispersions comprise particles of acrylate polymers which are in disperse distribution in the aqueous phase of the dispersion. Acrylate dispersions are prepared customarily in an aqueous medium by polymerization of suitable monomers. The preparation process may involve either a batch operation or else the metered addition of one or more components during the polymerization. In the case of the batch process, all of the necessary components are included at the same time in the initial charge.

The properties of the acrylate dispersions and of the corresponding adhesives are determined primarily by the selection of the monomers and the molecular weight attained. The major monomers are n-butyl acrylate, 2-ethylhexyl acrylate and acrylic acid. Suitable monomer units are described in "Acrylic Adhesives", Donatas Satas in Handbook of Pressure Sensitive Adhesive Technology, Second Edition, edited by Donatas Satas, Van Nostrand Reinhold New York, pages 396 to 456.

Acrylate dispersions used contain in particular [in each case in % by weight]
0% to 10% acrylic acid units
0% to 100% n-butyl acrylate units
0% to 100% 2-ethylhexyl acrylate units.

In one preferred embodiment acrylate dispersions with 0.5% to 3% by weight of acrylic acid units are used. In another preferred embodiment acrylate dispersions with 0.5% to 3% by weight of acrylic acid units and 99.5% to 90% by weight, more preferably 99.5% to 96% by weight, of n-butyl acrylate units are used. Further examples of acrylate dispersions of the invention are acrylate dispersions with 80% to 90% by weight of 2-ethylhexyl acrylate units and 8 to 20% by weight of n-butyl acrylate units.

The acrylate dispersions may additionally comprise further monomer units through which it is possible, for example, to control the glass transition temperature and the crosslinkability. Examples are methyl acrylate, ethyl acrylate, methylethyl acrylate, maleic anhydride, acrylamide, glycidyl methacrylate, isopropyl acrylate, n-propyl acrylate, isobutyl acrylate, n-octyl acrylate, and the methacrylates corresponding to these acrylates. The acrylate dispersions customarily contain 0% to 10% by weight of these additional monomer units; either exclusively one additional monomer unit or mixtures thereof are used.

The glass transition temperature attained depends on the monomers employed. The acrylate dispersions that are used for the adhesives of the invention have, in the dried state, glass transition temperatures more particularly of between –80° C. and –15° C., preferably between –75° C. and –25° C. and more preferably between –55° C. and –35° C.

The solids content of the acrylate dispersions is more particularly between 30% and 70% by weight, preferably between 45% and 60% by weight.

Examples include the acrylate dispersions Primal PS 83d and Primal PS 90 from the company Rohm & Haas.

If desired, the dispersion may comprise further additives. Suitable crosslinking agents may be epoxy resins, amine derivatives such as, for example, hexamethoxymethylmelamine and/or condensation products of an amine, for example melamine, or urea with an aldehyde, for example formaldehyde. In order to obtain non-sticky polyacrylate dispersions it has been found that it is advantageous, where appropriate, to add further compounds which react, for example, with the carboxyl groups of the polymer. Examples of such are aziridines, such as ethylenimine and propylenimine.

The adhesives may comprise further components. Examples are resins, plasticizers, dyes, defoamers and thickeners, and also further adjuvants for setting the desired rheological behaviour. Modifications of acrylate dispersions are known and are described for example in "Modification of Acrylic Dispersions", Alexander Zettl in Handbook of Pressure Sensitive Adhesive Technology, Second Edition edited by Donatas Satas, Van Nostrand Reinhold New York, pages 457 to 493.

Aqueous resin dispersions, i.e. dispersions of resin in water, are known. Preparation and properties are described for example in "Resin Dispersions", Anne Z. Casey in Handbook of Pressure Sensitive Adhesive Technology, Second Edition, edited by Donatas Satas, Van Nostrand Reinhold New York, pages 545 to 566.

Resin dispersions of hydrocarbon resins and modified hydrocarbon resins are likewise known and are available for example from the company Hercules BV under the tradename Tacolyn (Example: Tacolyn 4177).

Suitable resin dispersions are those based on hydrocarbon resins or modified hydrocarbon resins with a softening point of between 50° C. and 100° C. The adhesive may comprise, for example, 5% to 28% by weight of the resin dispersions. The solids content of the resin dispersions is customarily between 40% and 70% by weight.

The adhesive may be admixed with resin dispersions based on mixtures of different hydrocarbon resins, and also on mixtures of hydrocarbon resins with other known resins. Possible, for example, are mixtures of hydrocarbon resins with small amounts of resins based on rosin or modified rosin or phenolic resins, other natural resins, resin esters or resin acids.

The adhesive may also be admixed with plasticizing components such as plasticizer resins, liquid resins, oils or other known components such as, for example, alkoxylated alkylphenols. Alkoxylated alkylphenols are known and described for example in U.S. Pat. No. 4,277,387 A and EP 0 006 571 A. The use of alkoxylated alkylphenols as plasticizers has been proposed in references including "Modification of Acrylic Dispersions", Alexander Zettl in Handbook of Pressure Sensitive Adhesive Technology, Second Edition, edited by Donatas Satas, Van Nostrand Reinhold New York, page 471.

The properties of the alkoxylated alkylphenols are determined by the alkyl radical and predominantly by the construction of the polyglycol ether chain. For the preparation it is possible to use both ethylene oxide and propylene oxide. In one particular embodiment propoxylated alkylphenol is used. Preference is given to water-insoluble alkoxylated alkylphenols. Additionally preferred are alkoxylated alkylphenols having a boiling point of greater than 100° C., preferably greater than 130° C. and more preferably greater than 200° C.

The adhesive can be optimized for greater shear strength by using crosslinkers. Selection and proportion of crosslinkers are known to the skilled person. Crosslinkers for acrylate dispersions are known in principle and described for example in "Acrylic Adhesives", Donatas Satas in Handbook of Pressure Sensitive Adhesive Technology, Second Edition, edited by Donatas Satas, Van Nostrand Reinhold New York, pages 411 to 419.

Crosslinkers based on isocyanate are suitable in principle, but are not preferred on account of the limited pot lives and the increased cost and complexity associated with workplace safety. An example of an isocyanate-based crosslinker is Basonat F DS 3425 X (BASF).

Isocyanate-free crosslinkers are preferred, examples being crosslinkers based on salts of polyfunctional metals. These crosslinkers are known in principle and are described for example in U.S. Pat. Nos. 3,740,366 A, 3,900,610 A, 3,770,780 A and 3,790,553 A. Particularly suitable crosslinkers are those based on zinc complexes which are able to form covalent and/or complex-type bonds with carboxyl groups.

Another adhesive which has proved to be suitable is one based on acrylate hotmelt with a K value of at least 20, more particularly greater than 30, which is obtainable by concentrating a solution of such an adhesive to give a system which can be processed as a hotmelt.

Concentration may take place in appropriately equipped tanks or extruders; particularly in the context of accompanying degassing, a degassing extruder is preferred.

One such adhesive is set out in DE 43 13 008 A1, whose content is hereby incorporated by reference to become part of the present disclosure and invention. In an intermediate step, the solvent is removed completely from these acrylate compositions prepared in this way.

Additionally, in the course of this procedure, further volatile constituents are removed. After coating from the melt, these compositions have only small fractions of volatile constituents. Hence it is possible to adopt all of the monomers/formulas that are claimed in the patent cited above. A further advantage of the compositions described is seen as being that they have a high K value and hence a high molecular weight. The skilled person is aware that systems with higher molecular weights can be crosslinked more efficiently. There is a corresponding reduction in the fraction of volatile constituents. The solution of the composition may contain 5% to 80% by weight, more particularly 30% to 70% by weight, of solvent.

It is preferred to use commercial solvents, especially low-boiling hydrocarbons, ketones, alcohols and/or esters.

With further preference use is made of single-screw, twin-screw or multiscrew extruders with one or, in particular, two or more degassing units.

Copolymerized in the acrylate hotmelt-based adhesive there may also be benzoin derivatives, examples being benzoin acrylate or benzoin methacrylate, acrylic esters or methacrylic esters. Benzoin derivatives of this kind are described in EP 0 578 151 A1. Alternatively the acrylate hotmelt-based adhesive may be chemically crosslinked.

In one particularly preferred embodiment, self-adhesive compositions used are copolymers of (meth)acrylic acid and the esters thereof having 1 to 25 C atoms, maleic, fumaric and/or itaconic acid and/or their esters, substituted (meth) acrylamides, maleic anhydride, and other vinyl compounds, such as vinyl esters, especially vinyl acetate, vinyl alcohols and/or vinyl ethers.

The residual solvent content ought to be below 1% by weight.

For fields of application of the encapsulated components that involve particularly high temperature loads, particular suitability is possessed by silicone rubbers, with their outstanding properties. In addition to a high UV resistance and ozone resistance, they exhibit, in particular, the combined functions of high temperature resistance, elasticity and pronounced damping with respect to shocks and vibrations. Moreover, long-term temperature loads in the range from −75° C. to 260° C. have no adverse effect on the physical properties of silicone rubbers.

As pressure-sensitive silicone adhesives it is possible with particular advantage to use not only the following condensation-crosslinking systems consisting of silicate resins and polydimethylsiloxanes or polydiphenylsiloxanes DC 280, DC 282, Q2-7735, DC 7358, Q2-7406 from Dow Corning, PSA 750, PSA 518, PSA 910 from GE Bayer Silicones, KRT 001, KRT 002, KRT 003 from ShinEtsu, PSA 45559 from Wacker Silicones, and PSA 400 from Rhodia, but also, with advantage, the following addition-crosslinking systems consisting of silicate resins, polydimethylsiloxanes or polydiphenylsiloxanes and crosslinkers (crosslinker substances, especially functionalized hydrosilanes) DC 7657, DC 2013 from Dow Corning, PSA 6574 from GE Bayer Silicones, and KR 3700 and KR 3701 from ShinEtsu.

To give the polymer layer(s) a greater strength it is frequently also sensible to carry out thermal crosslinking after all of the components needed for the photovoltaic module have been assembled. Particularly suitable for thermal crosslinking are peroxides such as, for example, Lupersol from Pennwalt Corp, Luccidol Division.

The transparent polymer layer and the second polymer layer may be present in the form of smooth or brushed sheet product. In an alternative embodiment both polymer layers are located, in particular in low layer thicknesses of 10 to 500 μm, on an auxiliary carrier. The auxiliary carrier may be a double-sidedly anti-adhesively coated material, such as a release paper or a release film, also called liner, and is removed after application. It does not form part of the resulting laminate.

The second polymer layer, filled with foaming agent, preferably has a density after foaming of less than 900 kg/m$^3$, more particularly of less than 700 kg/m$^3$.

In one advantageous embodiment of the invention the foaming agent comprises microspheres which are composed of a polymer membrane which encloses a blowing agent, referred to as microballoons.

The proportion of these microballoons in the second polymer layer is more preferably between 0.5% and 20% by weight, with further preference between 2% and 12% by weight.

Microballoons are elastic hollow spheres which have a thermoplastic polymer shell. These spheres are filled with low-boiling liquids or liquefied gas. As the shell material, polyacrylonitrile, PVDC, PVC or polyacrylates are used in particular. Low-boiling liquids that are suitable are, in particular, hydrocarbons of lower alkanes, isobutene or isopentane for example, which are enclosed in the form of liquefied gas under pressure in the polymer shell.

Action on the microballoons, in particular the action of heat, has the effect, on the one hand, of softening the outer polymer shell. At the same time the liquid propellant gas located in the shell undergoes conversion to its gaseous state. In this process, the microballoons expand irreversibly and three-dimensionally. Expansion comes to an end when the internal pressure equals the external pressure. Since the polymeric shell remains intact, a closed-cell foam is obtained in this way.

A multiplicity of types of microballoons are available commercially, such as, for example, the Expancel DU (dry unexpanded) types from Akzo Nobel, which differ essentially in their size (6 to 45 μm in diameter in the unexpanded state) and in the initial temperature they require for expansion (75° C. to 220° C.). When the type of microballoon and/or the foaming temperature has been matched to the machine parameters and to the temperature profile needed for compounding the composition, compounding of the composition and foaming may also take place simultaneously in one step.

Additionally suitable are unexpanded microballoon types in the form of aqueous dispersions having a solids fraction or microballoon fraction of approximately 40% to 45% by weight, and also in the form of polymer-bound microballoons (masterbatches), for example in ethylene-vinyl acetate, with a microballoon concentration of about 65% by weight. Not only the microballoon dispersions but also the masterbatches, like the DU products, are suitable for foaming adhesives in accordance with the method of the invention.

In accordance with a further advantageous embodiment of the invention, externally on the free side on the first polymer layer and/or externally on the free side on the second polymer layer there is at least one additional layer which preferably has a water vapour permeability of less than 200 g/m$^2$/24 h at 37.8° C., and 90% relative humidity and an oxygen permeability of less than 20 cm$^3$/m$^2$/24 h at 23° C. and 50% relative humidity. These layers thus offer further protection for the encapsulated components.

A suitable transparent layer is glass, more particularly a low-iron, tempered white glass, but also UV-stable and weathering-stable polymer films having a low water vapour permeability or water vapour permeation.

By permeation is meant the process in which a substance (permeate) migrates through or penetrates a solid body. The driving force is a concentration gradient. Permeability is tested by permeation measurement.

Permeation is measured, for example, by the flushing gas method.

Films and membranes can be tested accordingly both with any desired gases and with liquids of all kinds for their permeability. The measurement techniques for gases all include a central module which is divided by the membrane under test: On the feed side the measuring cell is overflowed with the test gas, and the remaining retentate is taken off. The amount of the gas arriving on the other side (permeate) is passed by the flushing gas to a detector, where the concentration is measured. Top and bottom parts of the cells surround the centred membrane. An O-ring which lies on the sample seals the interface. These kinds of cells are usually manufactured of a metal such as stainless steel, for example.

Suitable for the non-transparent layer, where appropriate, on the second polymer layer are, again, glass or UV-stable and weathering-stable films with a low water vapour permeability, such as a Tedlarfolie® film from DuPont.

Likewise suitable are films comprising a film section which is formed by at least one polymeric film of polyester in particular and also comprising a metallic part which is applied to the film part and is formed of a metallic layer of aluminum in particular, and adhesive being applied to the exposed side of the metallic layer.

The metallic layer acts in this as a barrier layer, and thus keeps corrosion-promoting substances such as water, water vapour, oxygen, sulphur dioxide and carbon dioxide away from the product to be protected (in particular the sheetlike functional layers).

In one first advantageous embodiment of the invention the metallic layer has a thickness of 10 nm to 50 μm, more particularly 12 to 25 μm.

The metallic layer is applied to the film part by means, for example, of vapour deposition, in other words by coating it on the polymeric film by thermal evaporation under reduced pressure (electrically with electron beams, by cathode sputtering or wire explosion, where appropriate with the aid of laser beams).

As a polymeric film it is preferred to use polyester.

Also exhibiting outstanding properties, besides polyester, are films made of, for example, PU, PP, PE, PVC, PVDC, PEN, PAN, EVOH and PA, PA with nanocomposites.

PA with nanocomposites comprises a PA filled with phyllosilicate. These particles have a platelet-shaped structure similar to talc. In contrast to talc, the particle size is considerably smaller (nanometer range). These particles are aligned on extrusion and form a layer structure. The particles themselves, like glass, are completely impermeable to gases. The gases are hindered from penetrating the film, thereby producing the enhanced barrier effect. The layer structure forms a kind of labyrinth through which the gases and flavours must pass. On account of the small particle size, the optical properties of the film are unaffected.

For the polymeric film, films 10 μm to 160 μm thick are preferred.

In a further advantageous embodiment of the invention the film part is composed of a laminate of polymeric films, and preferably of a polyester film and a polyolefin film, the polyolefin film being provided, with further preference, with the metallic layer.

The polymeric films are bonded using binders (laminating resins) such as epoxy resins, melamine resins, thermoplastics, etc.

Preference is given to polyester films 10 μm to 40 μm thick and to polyolefin films 20 μm to 120 μm thick.

In addition it is also possible to employ three-ply or multiply laminates, without departing from the scope of the invention.

Furthermore, symmetrical laminate constructions around an Al foil core may be of advantage in particular fields of application.

Additionally it is advantageous if there is a second film part between metallic layer and adhesive.

In this case the two film parts are preferably composed of identical polymeric films, and with further preference the second foil part is likewise a laminate of a polyester film and of a polyolefin film; again, in particular, the polyolefin film bears against the metallic layer.

FIG. 1 shows the structure of the sealing system in one advantageous embodiment. The second polymer layer 4, which is filled with unactivated foaming agent, in this case unexpanded microballoons, is located on an additional layer in the form of a cover 5 (polymeric film). Disposed above the second polymer layer 4 is the product 3 to be encapsulated (solar cells). The sealing system is completed by the first transparent polymer layer 2, which is located in turn on an additional layer in the form of a transparent cover 1. The optically active side of the solar cells is therefore covered only by transparent layers.

FIG. 2 shows the sealing system after sealing has occurred. The two polymer layers 2 and 6 are welded to one another, and the microballoons in the second polymer layer 6 have undergone expansion. In this way this polymer layer flows rapidly and securely completely around the product to be encapsulated, so that all of the gaps between the solar cells are filled.

The two polymer layers serve to fix the optoelectronic components and form two substrates which provide a barrier to water vapour and oxygen.

Thus the components to be encapsulated are embedded between a first transparent polymer layer and a filled polymer layer, and then the foaming agent is activated, so that the two polymer layers weld to one another and the components are enclosed between the two polymer layers.

Unforeseeable for the skilled person was the fact that the connection between the foamed and the unfoamed polymer layers is so stable that reliable encapsulation of the components is ensured. The encapsulation step is sufficiently quick that there is no shift in the product to be encapsulated during encapsulation; fixing by means of an auxiliary adhesive tape is no longer necessary.

Moreover, the workstep of trimming the edges after lamination is unnecessary, since hardly any polymer emerges beyond the edges.

Microballoon foamed polymer layers and (self-)adhesives are notable for a defined cell structure with a uniform size distribution of the foam cells. They are closed-cell microfoams without cavities, hence making it possible to provide better sealing of sensitive goods against dust and liquid media in comparison to open-cell versions.

As a result of their flexible thermoplastic polymer shell, foams of this kind possess a greater conformability than those filled with unexpandable, non-polymeric hollow microspheres (hollow glass beads). They are more suited to compensating manufacturing tolerances than is generally the case, for example, with injection mouldings, and on account of their foam character are also able better to compensate thermal stresses.

Furthermore, through the selection of the thermoplastic resin of the polymer shell, the mechanical properties of the foam can be influenced further. Thus, for example, it is possible, even when the foam has a lower density than the matrix, to produce foams having a higher cohesive strength than with the polymer matrix alone. Thus typical foam properties such as the conformability to rough substrates can be combined with a high cohesive strength for PSA foams.

Conventionally chemically or physically foamed materials, in contrast, are more susceptible to irreversible collapse under pressure and temperature. There, in addition, the cohesive strength is lower.

Accordingly the preferred embodiment of the method offers considerable advantages which it was hitherto not possible for a skilled person to infer.

In one possible embodiment of the method, the layers shown in FIG. 1 are arranged above one another. This arrangement is pressed in a press, preferably at 160° C. and/or without pressurization. Pressing may optionally take place under reduced pressure. In the press, the foaming agent is stimulated to foam, and so the two polymer layers weld to one another and the components are enclosed between the two polymer layers.

FIGS. 3 to 5 show the procedure of the method of this invention, using a roll laminator.

In the first step (FIG. 3) the first, transparent polymer layer 2 is placed onto a transparent cover 1, the layer 2 being located in turn on an auxiliary carrier 7. Lamination takes place in a roll nip.

The three-ply product produced can be wound or stored, or may alternatively be supplied directly to subsequent further processing.

The auxiliary carrier 7 is removed prior to sealing; it does not become part of the resultant sealing system.

FIG. 4 shows how the first, transparent polymer layer 2, on a transparent cover 1 (produced according to FIG. 3, after removal of the auxiliary carrier 7), the transparent polymer layer 2—and specifically the side opposite the side covered with the transparent cover 1—bearing the components 3 to be encapsulated, and the second polymer layer 4, filled with unactivated foaming agent (microballoons), on a further cover 5, are guided into a roll nip of a roll laminator. The transparent cover 1 and the further cover 5 run directly over the rolls.

In the roll nip of the roll laminator the microballoons are foamed, and so the two polymer layers 2 and 6 weld to one another and the components 3 are enclosed between the two polymer layers 2 and 6.

The rate of advance at which the layers are processed in the roll laminator is preferably 0.1 m/min to 3 m/min, more preferably 0.2 m/min to 1 m/min. The temperature of the rolls is 160° C.; the pressure in the cylinder by which the upper, movable roll is pressed against the lower, fixed roll is 2 bar. The rolls are soft rubber rolls.

FIG. 5 shows how the first, transparent polymer layer 2, on a transparent cover 1 (produced according to FIG. 3, after removal of the auxiliary carrier 7), the components 3 to be encapsulated, and the second polymer layer 4, filled with unactivated foaming agent, on a further cover 5, are guided independently into a roll nip of a roll laminator, the transparent cover 1 and the further cover 5 running directly over the rolls, and the components 3 to be encapsulated being guided between the two polymer layers 2 and 4. In the roll nip of the roll laminator the microballoons are foamed, and so the two polymer layers 2 and 6 weld to one another and the components 3 are enclosed between the two polymer layers 2 and 6.

The rate of advance at which the layers are processed in the roll laminator is preferably 0.1 m/min to 3 m/min, more preferably 0.2 m/min to 1 m/min. The temperature of the rolls is 160° C.; the pressure in the cylinder by which the upper, movable roll is pressed against the lower, fixed roll is 2 bar. The rolls are soft rubber rolls.

The invention is elucidated in more detail below, with reference to an example, without any intention that this should restrict it in any form.

EXAMPLES

Example

Polymer basis ethylene-vinyl acetate:
Ethylene-vinyl acetate rubber "Levamelt 456" (Lanxess) with 45% by weight vinyl acetate content
Experimental procedure and experimental structure are shown in FIG. 6.
The sealing system is composed of the following layers:
3 mm glass plate
100 g/m² first, transparent polymer layer
product to be encapsulated, height 985 µm
550 g/m² second, microballoon-filled polymer layer
cover PET/PP/Al/PP/PET, thickness 142 µm The first, transparent polymer layer 2, composed of Levamelt 456, with a 40% by weight solids content in toluene, is prepared in a laboratory using a customary stirring apparatus and then coated using a doctor blade onto an antiadhesive liner, with a coat weight of 100 g/m². Subsequently this polymer layer 2 is transferred to a glass plate 1 which is 3 mm thick.

The product 3 to be encapsulated, with a height of 985 µm, is then fixed to this gently adhering polymer layer 2, and the second, microballoon-filled polymer layer 4 is laminated over it.

This microballoon filled polymer layer 4, composed of 98% by weight Levamelt 456 and 2% by weight Expancel 051 DU 40 (microballoons from Akzo Nobel), with a 40% by weight solids content in toluene, is likewise prepared in the laboratory, in a stirring apparatus, and coated out with a coat weight of 550 g/m² onto a 5-layer laminate of films with the sequence PET/PP/Alu/PP/PET (Nordenia), with a water vapour permeability of less than 0.005 g/m²/24 h at 37.8° C.

and 90% relative humidity and an oxygen permeability of less than 0.005 cm³/m²/24 h at 23° C. and 50%, which serves simultaneously as a cover 5.

The experimental specimen prepared in this way is then heated by means of a conventional press (applied pressure toward 0 bar) in order to initiate the foaming of the microballoons and hence to enclose and to seal the product to be encapsulated.

In preliminary tests a residence time or pressing time of 1.5 min and a temperature of 160° C. were found to be optimum temperature parameters and foaming parameters; in other words, the maximum foaming rate and hence also a complete and reliable encapsulation, with absence of air bubbles, are achieved (see Table 1: Determination of optimum foaming/encapsulation parameters).

TABLE 1

Determination of optimum foaming/encapsulation parameters

| Pressure | Sealing rate [%] | | |
|---|---|---|---|
| time [s] | at 140° C. | 150° C. | 160° C. |
| 0 | 0 | 0 | 0 |
| 60 | 0 | 0 | 40 |
| 75 | 23 | 30 | 65 |
| 90 | 35 | 70 | 100 |
| 105 | 90 | 100 | — |
| 120 | 100 | — | — |

The sealing rate is the ratio of the total area to the areal fraction of air inclusion which surrounds the product to be encapsulated when sealing is still not complete. This means that, if transparent polymer layer A is still not joined to polymer layer B, the sealing rate is 0%, and vice versa.

At a temperature of 160° C., an optimum is found the most quickly and most stably after a pressing time of just 90 s.

Figure 7:
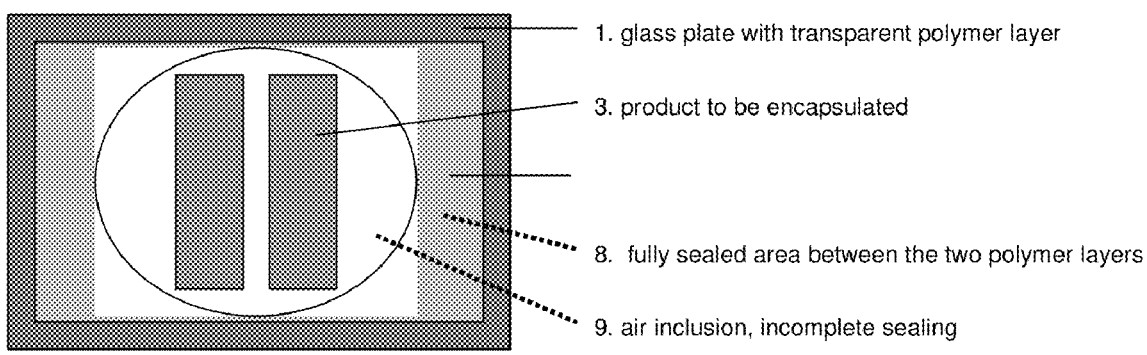
FIG. 7 is another view of the experimental structure used in the Example.

As a comparison, FIG. 7 shows a sealing rate of approximately 50%.

Example 2—Comparative Example

Polymer basis ethylene-vinyl acetate:
Ethylene-vinyl acetate rubber "Levamelt 456" (Lanxess) with 45% by weight vinyl acetate content The purpose of this comparative example is to investigate and compare the sealing performance of an unfilled or unfoamed composition versus a microballoon-foamed composition with the same Levamelt 456 polymer basis.

Accordingly the effect of microballoon foaming on the quality and nature of the encapsulation becomes distinctly recognizable, and advantages over sealing with unfoamed composition systems can be ascertained.

Experimental procedure and experimental structure are similar to those in Example 1. Here, though, the second polymer layer is filled not with 2% by weight of microballoons, but instead with 1% by weight of titanium dioxide, in order to ensure better visibility of the product to be encapsulated in relation to the transparent covers, and the sealing rate. The experimental specimen prepared in this way is now likewise heated using a conventional press (applied pressure towards 0 bar) at 160° C. and the completeness of the sealing performance is checked after a number of regular time intervals.

Optimum and complete encapsulation (see Table 2) was achieved only after 10 min at 160° C. Moreover, an additional unwanted change to the experimental specimen was found, which does not correspond to the concept of the invention.

After a pressing time of just 5 minutes, the unfoamed polymer matrix expands in such a way that it deforms and shifts the arrangement and position of the product to be encapsulated on the transparent polymer layer A and in the system as a whole.

With an unfoamed polymer layer, therefore, it is not possible to achieve reliable sealing and simultaneous permanent positioning of the product to be encapsulated.

TABLE 2

Sealing rate of the reference specimen

| Pressure | Sealing rate [%] | |
|---|---|---|
| Time [min] | 150° C. | 160° C. |
| 0 | 0 | 0 |
| 2 | 0 | 20 |
| 5 | 30 | 55 |
| 10 | 70 | 100 |
| 15 | 100 | 100 |

This is apparent in FIG. 7. On account of the deficient flow properties of the heated second polymer layer, it is not possible fully to surround the components. Although the two polymer layers seal completely (8) in the marginal region, there are, nevertheless, air inclusions around the components, and hence sealing is incomplete (9) (sealing rate of approximately 50%).

The inventive sealing through foaming of microballoon-filled composition systems thus shortens the time needed for completing encapsulation, and hence represents a gentle sealing operation and is beneficial to the quality.

The invention claimed is:

1. A method of encapsulating optoelectronic components, the method comprising:
    embedding optoelectronic components, to be encapsulated, between a first transparent polymer layer and a second polymer layer, wherein the second polymer layer is filled with an unactivated foaming agent that is present in an amount between 0.5% and 20% by weight of the second polymer layer; and
    activating the foaming agent, so that the two polymer layers inseparably join to one another, wherein the optoelectronic components are enclosed between the two polymer layers.

2. The method according to claim 1, wherein the foaming agent comprises microspheres which are composed of a polymer membrane which encloses a blowing agent.

3. The method according to claim 1, wherein externally on the free side on the first polymer layer and/or externally on the free side on the second polymer layer there is at least one additional layer which has a water vapour permeability of less than 200 g/m²/24 h at 37.8° C., and 90% relative humidity and an oxygen permeability of less than 20 cm³/m²/24 h at 23° C. and 50% relative humidity.

4. The method according to claim 1, wherein the first transparent polymer layer has a transmittance of greater than 60%, for a wavelength of 350 to 1150 nm.

5. The method according to claim 1, wherein the first transparent polymer layer has a thickness of 10 to 500 μm.

6. The method according to claim 1, wherein the second polymer layer, filled with foaming agent, has a density after foaming of less than 900 kg/m³.

7. The method according to claim 1, wherein the first transparent polymer layer and/or the second polymer layer are present on an anti-adhesively treated auxiliary carrier.

8. The method according to claim 1, wherein a transparent layer of glass or a UV-stable and weathering-stable plastic with low water vapour permeability is selected as an additional layer above the first polymer layer, and/or a layer of glass or of a single-layer or multi-layer, UV-stable and weathering-stable polymeric film of low water vapour permeability is selected as an additional layer below the second polymer layer.

9. The method according to claim 1, wherein the second polymer layer is located on a first additional layer in the form of a cover, wherein the optoelectronic components to be encapsulated are disposed over the second polymer layer, wherein the first transparent polymer layer is located over the second polymer layer, wherein the first transparent polymer layer is located on a second additional layer in the form of a transparent cover, wherein, in this arrangement and under reduced pressure in a press, the foaming agent is induced to foam, such that the two polymer layers weld to one another, wherein the optoelectronic components are enclosed between the two polymer layers.

10. The method according to claim 1, wherein the first transparent polymer layer is located on a transparent cover, wherein the optoelectronic components to be encapsulated and the second polymer layer are located on a further cover, wherein the transparent cover, the first transparent polymer layer, the optoelectronic components, the second polymer layer, and the further cover are guided into a roll nip of a roll laminator, wherein the transparent cover and the further cover run directly over the rolls, wherein the optoelectronic components to be encapsulated are guided between the two polymer layers, wherein foaming of the foaming agent takes place in the roll nip, such that the two polymer layers are welded to one another and the optoelectronic components are enclosed between the two polymer layers.

11. The method according to claim 1, wherein the first transparent polymer layer is located on a transparent cover, wherein the optoelectronic components to be encapsulated being are disposed on the transparent polymer layer on a side opposite the side covered by the transparent cover, wherein the second polymer layer is located on a further cover, wherein the transparent cover, the first transparent polymer, the optoelectronic components, the second polymer layer and the further cover are guided into a roll nip of a roll laminator, wherein the transparent cover and the further cover run directly over the rolls, wherein foaming of the foaming agent takes place in the roll nip, such that the two polymer layers are welded to one another and the optoelectronic components are enclosed between the two polymer layers.

12. The method according to claim 1, wherein the foaming agent is present in an amount between 2% and 12% by weight of the second polymer layer.

13. The method according to claim 1, wherein the foaming agent comprises hydrocarbons of lower alkanes.

14. The method according to claim 13, wherein the hydrocarbons of lower alkanes comprise isobutene or isopentane.

15. The method according to claim 1, wherein the foaming agent comprises a liquid propellant gas located within a polymer shell.

16. The method according to claim 1, wherein the foaming agent comprises unexpanded microballons in the form of aqueous dispersions having a microballoon fraction of approximately 40% to 45% by weight of the aqueous dispersions or in the form of polymer-bound microballons having a microballon concentration of about 65% by weight of the polymer-bound microballons.

17. The method according to claim 1, wherein the joining of the two polymer layers to one another comprises welding the two polymer layers to one another such that the two polymer layers are inseparable from each other.

18. A method of encapsulating optoelectronic components, the method comprising:
    embedding optoelectronic components, to be encapsulated, between a first transparent polymer layer and a second polymer layer, wherein the second polymer layer is filled with an unactivated foaming agent; and
    activating the foaming agent, so that the two polymer layers are welded to one another and are inseparable from one another and the optoelectronic components are enclosed between the two polymer layers.

19. The method according to claim 18, wherein the foaming agent comprises microspheres which are composed of a polymer membrane which encloses a blowing agent, wherein the blowing agent comprises hydrocarbons of lower alkanes.

20. The method according to claim 19, wherein the hydrocarbons of lower alkanes comprise isobutene or isopentane.

* * * * *

UNITED STATES PATENT AND TRADEMARK OFFICE
CERTIFICATE OF CORRECTION

PATENT NO. : 7,976,750 B2  Page 1 of 1
APPLICATION NO. : 12/437743
DATED : July 12, 2011
INVENTOR(S) : Burmeister It is certified that error appears in the above-identified patent and that said Letters Patent is hereby corrected as shown below:

In the Claims

Column 16, Claim 16, line 17, "microballons"-- should read --microballoons--.

Column 16, Claim 16, line 20, "microballons"-- should read --microballoons--.

Column 16, Claim 16, line 21, "microballons"-- should read --microballoons--.

Column 16, Claim 16, line 22, "microballons"-- should read --microballoons--.

Signed and Sealed this
Seventeenth Day of December, 2013

Margaret A. Focarino
*Commissioner for Patents of the United States Patent and Trademark Office*